(12) United States Patent
Cao et al.

(10) Patent No.: US 9,946,394 B2
(45) Date of Patent: Apr. 17, 2018

(54) GATE DRIVERS AND THE TOUCH PANELS HAVING THE GATE DRIVERS

(71) Applicants: Shenzhen China Star Optoelectronics Technology Co., Ltd., Shenzhen, Guangdong (CN); Wuhan China Star Optoelectronics Technology Co., Ltd., Whuan, Hubei (CN)

(72) Inventors: Shangcao Cao, Guangdong (CN); Juncheng Xiao, Guandong (CN)

(73) Assignees: Shenzhen China Star Optoelectronics Technology Co., Ltd, Shenzhen, Guangdong (CN); Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 173 days.

(21) Appl. No.: 14/909,178

(22) PCT Filed: Nov. 23, 2015

(86) PCT No.: PCT/CN2015/095327
§ 371 (c)(1),
(2) Date: Feb. 1, 2016

(87) PCT Pub. No.: WO2017/084108
PCT Pub. Date: May 26, 2017

(65) Prior Publication Data
US 2017/0262115 A1  Sep. 14, 2017

(30) Foreign Application Priority Data

Nov. 18, 2015 (CN) .......................... 2015 1 0799877

(51) Int. Cl.
*G06F 3/041* (2006.01)
*G06F 3/044* (2006.01)
(Continued)

(52) U.S. Cl.
CPC ........ *G06F 3/0416* (2013.01); *G02F 1/13338* (2013.01); *G02F 1/13454* (2013.01); *G06F 3/044* (2013.01)

(58) Field of Classification Search
CPC ........................... G11C 19/28; H03K 5/15093
See application file for complete search history.

(56) References Cited

U.S. PATENT DOCUMENTS

2011/0150169 A1* 6/2011 Lin ........................ G11C 19/28
377/64
2013/0241814 A1* 9/2013 Hirabayashi ......... G09G 3/3677
345/100

(Continued)

FOREIGN PATENT DOCUMENTS

CN  103578433 A  2/2014
CN  103161939 A  4/2014

(Continued)

*Primary Examiner* — Kenneth Bukowski
(74) *Attorney, Agent, or Firm* — Andrew C. Cheng

(57) ABSTRACT

A gate driver includes a plurality of gate driver units. Each of the gate driver units includes a GOA driving circuit and at least one buffer GOA driving circuits at multiple levels. The GOA driving circuit outputs output signals during a display stage, wherein the output signals are transmitted to gate lines and the buffer GOA driving circuits at multiple levels. The output signals are transmitted between the levels when the buffer GOA driving circuits at the multiple levels are during a touch stage, and the output signals are transmitted to the GOA driving circuit of the driving unit at the next level. In addition, a touch panel includes the above gate driver.

5 Claims, 3 Drawing Sheets

(51) Int. Cl.
*G02F 1/1333* (2006.01)
*G02F 1/1345* (2006.01)

(56) References Cited

U.S. PATENT DOCUMENTS

| | | | | |
|---|---|---|---|---|
| 2014/0159997 | A1* | 6/2014 | Chen | G09G 3/3611 345/87 |
| 2014/0219412 | A1* | 8/2014 | Chien | G11C 19/28 377/68 |
| 2015/0091822 | A1* | 4/2015 | Dong | G06F 3/0416 345/173 |
| 2016/0124830 | A1* | 5/2016 | Banerjee | G06F 11/3409 714/37 |
| 2016/0224175 | A1* | 8/2016 | Moon | G06F 3/0412 |
| 2016/0247442 | A1* | 8/2016 | Dai | G09G 3/3677 |
| 2016/0266700 | A1* | 9/2016 | Ji | G06F 3/0412 |
| 2016/0372078 | A1* | 12/2016 | Song | G09G 3/20 |

FOREIGN PATENT DOCUMENTS

| | | |
|---|---|---|
| CN | 103761939 A | 4/2014 |
| CN | 104505049 A | 4/2015 |
| CN | 104658466 A | 5/2015 |

* cited by examiner

GATE DRIVERS AND THE TOUCH PANELS HAVING THE GATE DRIVERS

BACKGROUND OF THE INVENTION

1. Field of the Invention

The present disclosure relates to display technology, and more particularly to a gate driver and the touch panel having the gate driver.

2. Discussion of the Related Art

Currently, capacitive touch panels usually adopt three solutions including on glass solution (OGS) On-Cell (mounted) and In-Cell (embedded). The manufacturing process of In-Cell solution is characterized by attributes such as thinner, better transparency, and more stable structure, when compared with the OGS and the On-Cell.

With respect to the in-cell technology, generally, liquid crystal panels or OLED display panels are adopted as display panels. Taking the liquid crystal panel as one example, the gate driver on array (GOA) solution is adopted to manufacture the gate driver on the array substrate so as to conduct the column scanning driving toward the gate lines.

Regarding the capacitive touch panels adopting the In-Cell technology having high refresh rate, i.e., 120 Hz, the pixel cells on the liquid crystal panel are divided into a plurality of pixel blocks along a top-down direction. During a display scanning phase, the touch panel drives the corresponding pixel blocks by the GOA circuit, and then enters a touch scanning phase. This may enhance the touch sensibility, but may also contribute to the GOA circuit failure. During the touch scanning phase, the GOA circuit pauses the scanning driven toward the gate lines, which increases the electrical leakage risk of the gate of the thin film transistor connected with the gate line.

SUMMARY

In one aspect, a gate driver includes: a plurality of gate driver units, each of the gate driver units comprising a GOA driving circuit and at least one buffer GOA driving circuits at multiple levels; the GOA driving circuit outputting output signals during a display stage, wherein the output signals are transmitted to gate lines and the buffer GOA driving circuits at multiple levels; and the output signals are transmitted between the levels when the buffer GOA driving circuits at the multiple levels are during a touch stage, and the output signals are transmitted to the GOA driving circuit of the driving unit at the next level.

Wherein structures of the buffer GOA driving circuits at each of the levels are the same with the structures of the GOA driving circuit.

Wherein the GOA driving circuit comprises: a level transfer module configured for receiving the output signals outputted from the previous level and second clock signals, and for outputting first control signals in accordance with the output signals outputted from the previous level and the second clock signals, wherein the GOA driving circuit of the driving unit at the first level receives default initial signals and the second clock signals; an output module configured for receiving the first control signals and the first clock signals, outputting the output signals in accordance with the first control signals and the first clock signals, wherein the first clock signals and the second clock signals are opposite to each other; a pull-down module configured for receiving the first control signals and low level signals, and for stopping the output module from outputting in accordance with the first control signals and the low level signals; and a pull-down maintaining module configured for receiving high level signals, the low level signals, and the second clock signals, and for outputting pull-down control signals in accordance with the high level signals, the low level signals and the second clock signals, and wherein the pull-down control signals controls the pull-down module to stop the output of the output module.

Wherein the level transfer module further comprises a first transistor, a control end of the first transistor receives the second clock signals, an input end of the first transistor receives the output signals of the previous level, and an output end of the first transistor outputs the first control signals.

Wherein the output module comprises a second transistor and a third transistor, a control end of the second transistor connects to the output end of the first transistor, an input end of the second transistor receives the first clock signals, and an output end of the second transistor outputs the output signals; and a control end of the third transistor connects to the output end of the first transistor, an input end of the third transistor receives the first clock signals, and an output end of the third transistor outputs the output signals.

Wherein the pull-down module comprises a fourth transistor and a fifth transistor, a control end of the fourth transistor receives the pull-down control signals, an input end of the fourth transistor connects to the output end of the third transistor, and the output end of the fourth transistor receives the low level signals; and a control end of the fifth transistor receives the pull-down control signals, an input end of the fifth transistor connects to the output end of the first transistor, and the output end of the fifth transistor receives the low-level signals.

Wherein The pull-down maintaining module comprises a sixth transistor, a seventh transistor, an eighth transistor and a capacitor; wherein a control end of the sixth transistor connects to the output end of the first transistor, an input end of the sixth transistor connects to the control end of the fifth transistor, and the output end of the sixth transistor receives the low level signals; a control end of the seventh transistor connects to an input end of the eighth transistor, an input end of the seventh transistor receives the high level signals, and an output end of the seventh transistor connects to the control end of the fifth transistor; a control end of the eighth transistor connects to the output end of the first transistor, and an output end of the eighth transistor receives the low level signals; and one end of the capacitor receives the second clock signals, and the other end of the capacitor connects to the input end of the eighth transistor.

Wherein the first transistor to the eighth transistor are N-type transistors, and the control ends of the transistors correspond to gates of the N-type transistor, the input ends correspond to sources of the N-type transistor, and the output end correspond to drains of the N-type transistor.

Wherein during the touch stage, time periods of the first clock signals and the second clock signals are gradually increased.

In another aspect, a touch panel includes: a gate driver comprises a plurality of gate driver units, each of the gate driver units comprising a GOA driving circuit and at least one buffer GOA driving circuits at multiple levels; the GOA driving circuit outputting output signals during a display stage, wherein the output signals are transmitted to gate lines and the buffer GOA driving circuits at multiple levels; and the output signals are transmitted between the levels when the buffer GOA driving circuits at the multiple levels are during a touch stage, and the output signals are transmitted to the GOA driving circuit of the driving unit at the next level.

By configuring the buffer GOA driving circuits at multiple levels to output signals during a touch stage, the output signals are prevented from being interrupted. In this way, the electrical leakage issue of the transistors, such as the TFTs, connected with the gate lines is resolved.

BRIEF DESCRIPTION OF THE DRAWINGS

The following description of the accompanying drawings, the foregoing and other exemplary aspects, features and advantages of the claimed invention, certain exemplary embodiments will become more apparent.

DETAILED DESCRIPTION OF THE EMBODIMENTS

Figure 1:
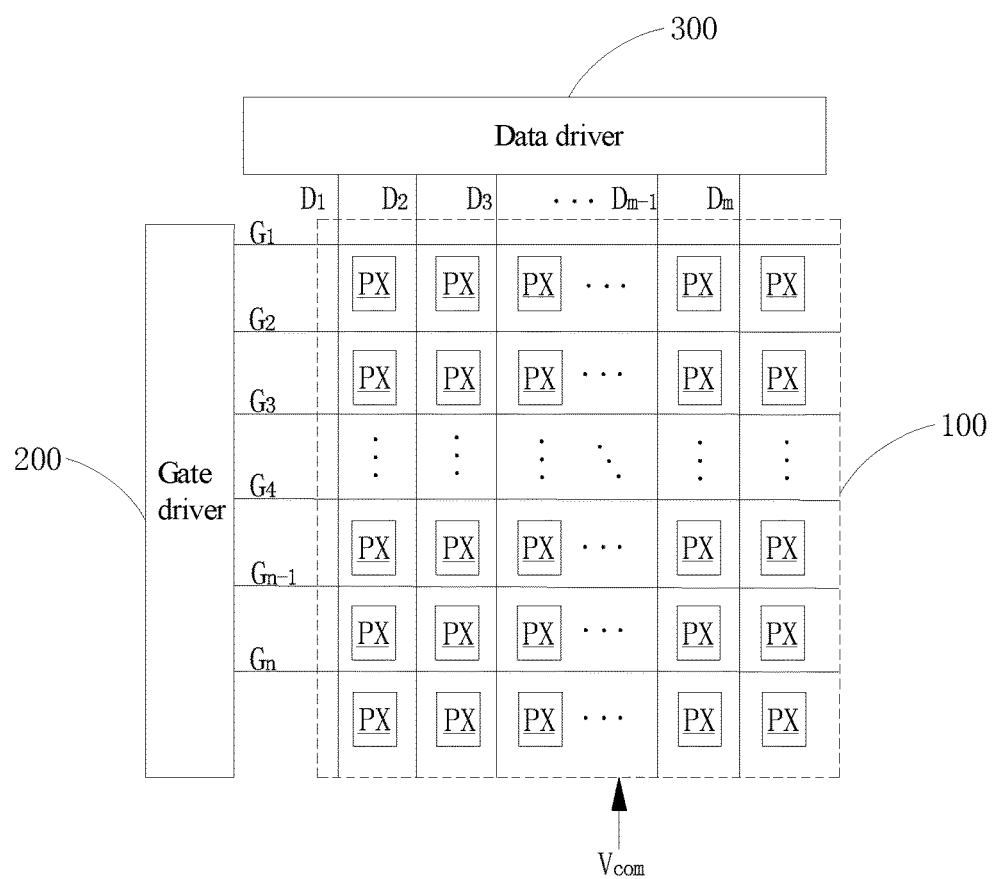
FIG. 1 is a schematic view of the touch panel in accordance with one embodiment.

Various example embodiments will now be described more fully with reference to the accompanying drawings in which some example embodiments are shown. In the drawings, the thicknesses of layers and regions may be exaggerated for clarity. In the following description, in order to avoid the known structure and/or function unnecessary detailed description of the concept of the invention result in confusion, well-known structures may be omitted and/or functions described in unnecessary detail.

It should be noted that the relational terms herein, such as "first" and "second", are used only for differentiating one entity or operation, from another entity or operation, which, however do not necessarily require or imply that there should be any real relationship or sequence.

It is to be noted that, in one embodiment, the capacitive touch panel adopting the In-Cell technology is taken an example. With respect to the capacitive touch panel adopting the In-Cell technology, the liquid crystal panel or the OLED panel may be adopted, and the liquid crystal panel is taken as one example hereinafter.

FIG. 1 is a schematic view of the touch panel in accordance with one embodiment.

Referring to FIG. 1, the touch panel 100 includes a plurality of gate lines ($G_1$) through ($G_n$) for transmitting gate signals and a plurality of data lines ($D_1$) through ($D_m$). The gate lines ($G_1$) through ($G_n$) extends along the column direction and are parallel to each other, and the data lines ($D_1$) through ($D_m$) extends along the row direction and are parallel to each other.

Each of the pixels (PX) includes a switch component connecting with the corresponding gate line and the corresponding data line, and a liquid crystal capacitor connecting with the switch component. In an example, each of the pixels (PX) may include a storage capacitor connecting with the liquid crystal capacitor in parallel. In the embodiment, the switch component may be, but not limited to, thin film transistor (TFT).

The down substrate 200 connects to the gate lines ($G_1$) through ($G_n$). Referring to FIG. 1, the down substrate 200 is arranged at one side of the touch panel 100, and the gate lines ($G_1$) through ($G_n$) connect to the down substrate 200. Nevertheless, the claimed invention is not limited to the above. That is, two gate driver units may be arranged at two sides of the touch panel 100. In addition, the gate lines ($G_1$-$G_n$) may connect to each of the gate driver units. For instance, with respect to the large-scale touch panel, it is difficult to transmit the gate signals from one end of the gate lines ($G_1$-$G_n$) to the other end only by one gate driver. In order to solve this issue, two gate driver units may be configured, wherein one gate driver connects to one end of the gate lines ($G_1$-$G_n$), and the other gate driver connects to the other end of the gate lines ($G_1$-$_n$).

The data driver 300 connects to the data lines ($D_1$-$D_m$) on the touch panel 100, and may apply the grayscale voltage generated from the grayscale voltage generator (not shown) to the pixels (PX) as the data voltage. If the grayscale voltage generator only provides the reference grayscale voltage, instead of all of the grayscale voltage, the data driver 300 may generate all of the grayscale voltage by the reference grayscale voltage, and then select one of the grayscale voltage as one data voltage. The difference between the data voltage applied to each of the pixels (PX) and the common voltage (Vcom) provided by the common electrode (not shown) may be viewed as the voltage charging the liquid crystal capacitors of each of the pixels (PX), that is, the pixel voltage. The alignment of the liquid crystal molecules within the liquid crystal layer may vary in accordance with the amplitude of the pixel voltage. Thus, the polarity of the light beams transmitted by the liquid crystal layer may also vary, which change the transmission rate of the liquid crystal layer.

The display and touch of the touch panel 100 are performed in a time-division manner. During a display stage, the common electrode provides the common voltage (Vcom) to the corresponding pixels (PX). During a touch stage, the common electrode may operate as one driving electrode for generating the driving signals.

Figure 2:
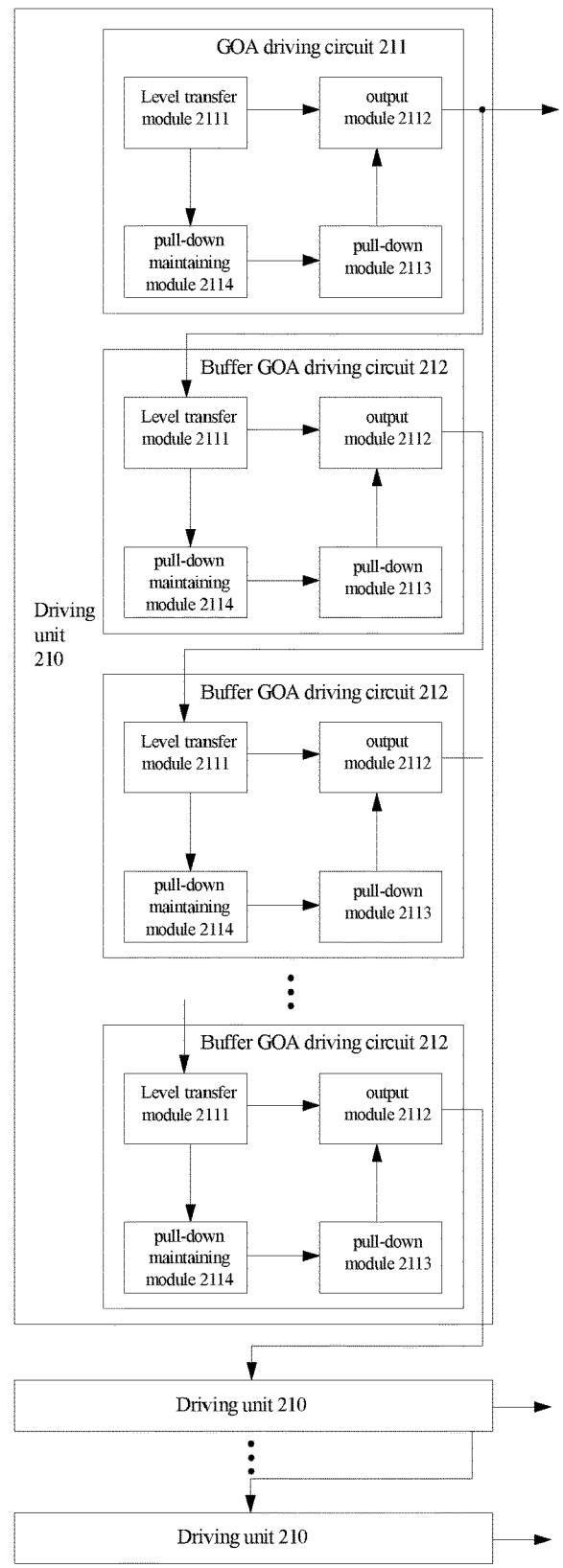
FIG. 2 is a block diagram of the gate driver in accordance with one embodiment.

FIG. 2 is a block diagram of the gate driver in accordance with one embodiment. The gate driver 200 will be described hereinafter.

Referring to FIG. 2, the gate driver 200 includes the driving units 210 arranged in a plurality of levels. In the embodiment, the structure of the driving units 210 are the same, and the driving unit 210 at the n-th level will be described hereinafter.

The driving unit 210 at the n-th level includes a GOA driving circuit 211 and buffer GOA driving circuits 212 at multiple levels. In the embodiment, the structures of the GOA driving circuit 211 and the buffer GOA driving circuits 212 at each of the levels are the same. The difference only resides in that the GOA driving circuit 211 outputs output signals during the display stage. The output signals may operate as the scanning signals for driving the pixels in the display are (AA area) of the liquid crystal panel in one aspect. In another aspect, the output signals may be level signals transmitted to the buffer GOA driving circuits 212 at multiple levels. The output signals from the buffer GOA driving circuits 212 at each of the levels may be the level signals transmitted to the buffer GOA driving circuits 212 at the next level. The buffer GOA driving circuits 212 at the final level outputs the level signals transmitted to the GOA driving circuit 211 of the driving unit 210 at the next level. In this way, the output signals are transmitted between the levels when the buffer GOA driving circuits 212 at the multiple levels are during the touch stage, and the output signals are transmitted to the GOA driving circuit 211 of the driving unit 210 at the next level.

In the embodiment, the buffer GOA driving circuits 212 at multiple level are configured within the driving unit 210 of each of the levels to ensure the output signals may be continuously transmitted. For instance, during the display stage, the GOA driving circuit 211 provides the output signals to the gate line. During the touch stage, the GOA driving circuit 211 stops providing the output signals to the gate line. The output signals of the GOA driving circuit 211 are continuously transmitted by the buffer GOA driving circuits 212 at multiple level. In addition, the buffer GOA driving circuit 212 at the final level transmits the output signals to the GOA driving circuit 211 of the driving unit 210 at the next level when the next display stage begins.

As the structure of the buffer GOA driving circuits 212 at each of the levels and the GOA driving circuit 211 are the same, the GOA driving circuit 211 of the n-th driving unit 210 will be described as one example.

The GOA driving circuit 211 receives the low level signals (VGL), the high level signals (VGH), the output signals outputted from the previous level (Gn-1), which is the output signals from the driving unit 210 of the previous level, the first clock signals (CK) and the second clock signals (XCK). The GOA driving circuit 211 of the first-level driving unit 210 receives the output signals from the previous level as the default initial signals.

It can be understood that the buffer GOA driving circuits 212 at each of the levels receive the low level signals (VGL), the high level signals (VGH), the output signals from the previous level, which is the output signals from the GOA driving circuit 211 or the buffer GOA driving circuits 212, the first clock signals (CK), and the second clock signals (XCK).

Figure 3:
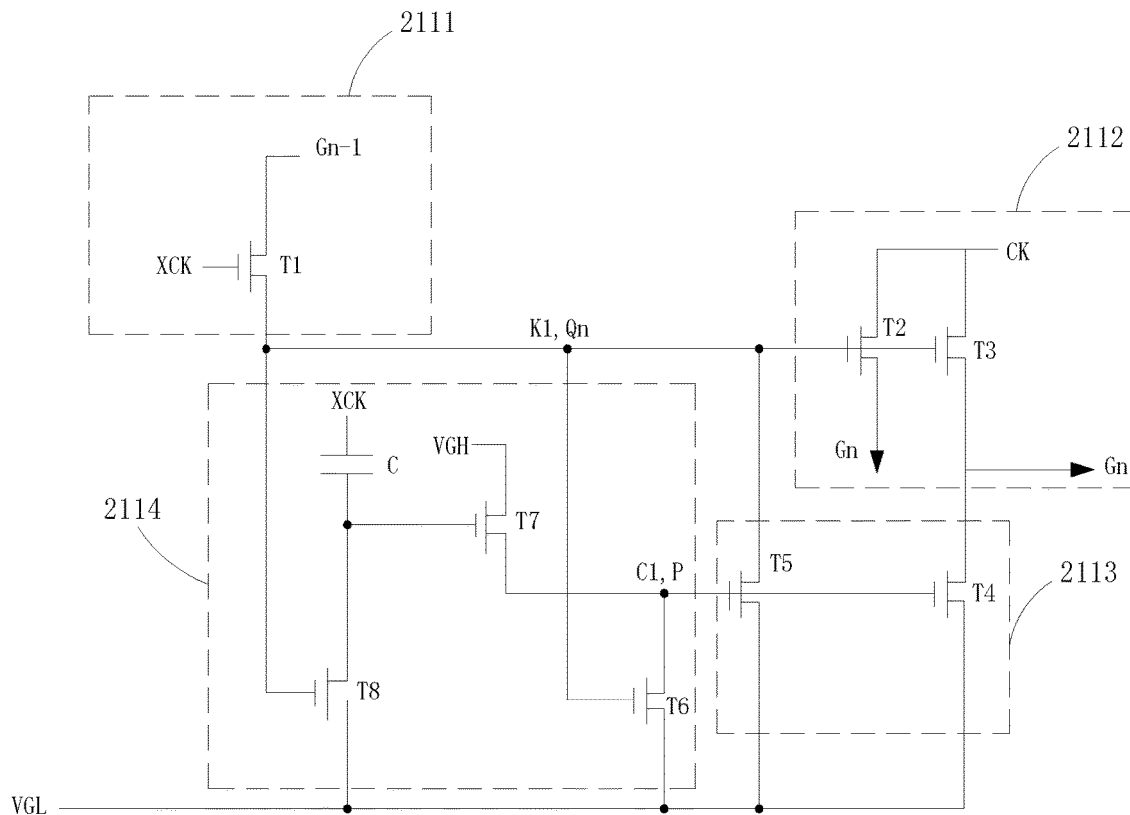
FIG. 3 is a block diagram of the GOA driving circuit in accordance with one embodiment.

FIG. 3 is a block diagram of the GOA driving circuit in accordance with one embodiment.

Referring to FIG. 3, the GOA driving circuit 211 includes a level transfer module 2111, an output module 2112, a pull-down module 2113, and a pull-down maintaining module 2114.

The level transfer module 2111 is configured for receiving the output signals outputted from the previous level (Gn-1) and the second clock signals (XCK). In addition, the level transfer module 2111 outputs the first control signals (K1) in accordance with the output signals outputted from the previous level (Gn-1) and the second clock signals (XCK). The first control signals (K1) outputs to the first node (Qn). The first node (Qn) is configured as an outputting node for controlling the driving signals.

The output module 2112 is configured for receiving the first control signals (K1) and the first clock signals (CK). In addition, the output module 2112 outputs the output signals (Gn) in accordance with the first control signals (K1) and the first clock signals (CK). The first clock signals (CK) and the second clock signals (XCK) are opposite to each other.

The pull-down module 2113 is configured for receiving the first clock signals (CK1) and the low level signals (VGL). In addition, the pull-down module 2113 is configured for pulling down the level of the first node (Qn) in accordance with the first control signals (K1) and the low level signals (VGL).

The pull-down maintaining module 2114 is configured for receiving the high level signals (VGH), the low level signals (VGL), and the second clock signals (XCK). The pull-down maintaining module 2114 outputs pull-down control signals (C1) in accordance with the high level signals (VGH), the low level signals (VGL), the second clock signals (XCK), wherein the pull-down control signals (C1) are outputted to the second node (Pn), and the second node (Pn) is configured for keeping the circuit stable when the circuit is during a non-operational period.

Alternatively, the level transfer module 2111 includes a first transistor (T1). The control end of the first transistor (T1) receives the second clock signals (XCK), the input end of the first transistor (T1) receives the output signals (STn-1) of the previous level, and the output end of the first transistor (T1) outputs the first control signals (K1). Specifically, the output end of the first transistor (T1) connects to the first node (Qn) to output the first control signals (K1) to the first node (Qn).

The output module 2112 includes a second transistor (T2) and a third transistor (T3). The control ends of the second transistor (T2) and the third transistor (T3) connect to the first node (Qn) to receive the first control signals (K1) from the first node (Qn). The input ends of the second transistor (T2) and the third transistor (T3) receives the first clock signals (CK), and the output ends of the second transistor (T2) and the third transistor (T3) output the output signals (Gn). The output signals (Gn) outputted from the output end of the second transistor (T2) may be the level signals, the output signals (Gn) outputted from the output end of the third transistor (T3) may drive the pixels within the display area of the liquid crystal panel. It is to be noted that, with respect to the buffer GOA driving circuits 212, the output signals (Gn) outputted from the second transistor (T2) and the third transistor (T3) may be the level signals.

The pull-down module 2113 includes a fourth transistor (T4) and a fifth transistor (T5). The fourth transistor (T4) and the fifth transistor (T5) connect to the second node (Pn) to receive the pull-down control signals (C1) from the second node (Pn). The input end of the fourth transistor (T4) connects to the output end of the third transistor (T3), and the output end of the fourth transistor (T4) receives the low level signals (VGL). The input end of the fifth transistor (T5) connects to the first node (Qn) to receive the first control signals (K1) from the first node (Qn) The output end of the fifth transistor (T5) receives the low level signals (VGL).

The pull-down maintaining module 2114 includes a sixth transistor (T6), a seventh transistor (T7), an eighth transistor (T8) and a capacitor (C). The control end of the sixth transistor (T6) connects to the first node (Qn) to receive the first control signals (K1) from the first node (Qn). The input end of the sixth transistor (T6) connects to the second node (Pn). The output end of the sixth transistor (T6) receives the low level signals (VGL). The control end of the seventh transistor (T7) connects to the input end of the eighth transistor (T8), the input end of the seventh transistor (T7) receives the high level signals (VGH), the output end of the seventh transistor (T7) connects to the second node (Pn) to receive the pull-down control signals (C1) from the second node (Pn). The control end of the eighth transistor (T8) connects to the first node (Qn) to receive the first control signals (K1) from the first node (Qn). The input end of the eighth transistor (T8) receives the low level signals (VGL). One end of the capacitor (C) receives the second clock signals (XCK), and the other end of the capacitor (C) connects to the input end of the eighth transistor (T8).

In the embodiment, the first transistor (T1) through the eighth transistor (T8) are N-type transistor. The control ends of the transistors correspond to the gate of the N-type transistor, the input ends correspond to the source of the N-type transistor, and the output end correspond to the drain of the N-type transistor.

Figure 4:
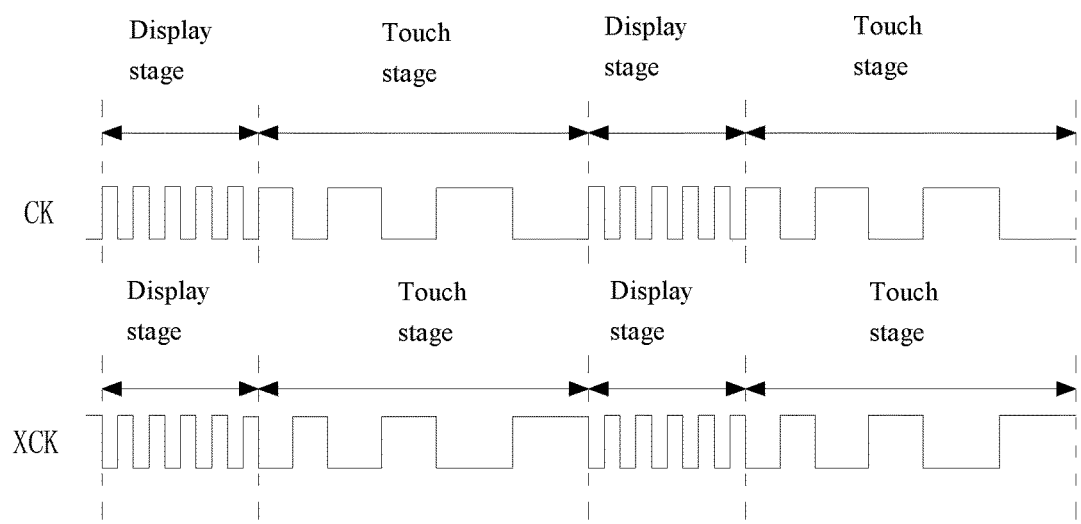
FIG. 4 is a wave diagram of the clock signals in accordance with one embodiment.

FIG. 4 is a wave diagram of the clock signals in accordance with one embodiment, wherein the first clock signals (CK) are opposite to the second clock signals (XCK).

Referring to FIGS. 3 and 4, during the display stage, the GOA driving circuit 211 may include four stages:

Level transfer stage: the second clock signals (XCK) and the output signals of the previous level (STn-1) are at high level. The first transistor (T1) is turned on. The output signals of the previous level (STn-1) operate as the first control signals (K1) to pull the first node (Qn) to the high level. The control ends of the second transistor (T2) and the third transistor (T3) are at high level, and thus are turned on. The control ends of the eighth transistor (T8) and the sixth transistor (T6) are at high level, and thus are turned on. At this moment, the second clock signals (XCK) at the high level charges the capacitor (C) such that the control end of the seventh transistor (T7) is at the low level, and the seventh transistor (T7) is turned off. At this moment, the pull-down control signals (C1) at the low level are outputted to the second node (Pn). The control ends of the fifth transistor (T5) and the fourth transistor (T4) are at the low level. Thus, the fourth transistor (T4) and the fifth transistor (T5) are turned off such that the output signals (Gn) are at the low level.

Output stage: the first clock signals (CK) are at the high level. At this moment, the first node (Qn) remains at the high level, and the second transistor (T2) and the third transistor (T3) are turned on. The output end of the second transistor (T2) outputs the output signals (Gn) operating as the level transfer signals. The output end of the third transistor (T3) outputs the output signals (Gn) driving the pixels within the display area of the liquid crystal panel.

The pull-down stage: the second clock signals (XCK) are at the high level again. The first transistor (T1) is turned on again. At this moment, the first control signals (K1) at the low level pulls the first node (Qn) to the low level. At this moment, the control ends of the second transistor (T2) and the third transistor (T3) are at the low level. Thus, the second transistor (T2) and the third transistor (T3) are turned off. At this moment, the output from the output ends of the second transistor (T2) and the third transistor (T3) are turned off.

The pull-down maintaining stage: the second clock signals (XCK) are at the high level again. The other end connected with the capacitor (C) and the input end of the eighth transistor (T8) is disconnected, and thus the control end of the seventh transistor (T7) is coupled as the high level, and the seventh transistor (T7) is turned on. The high level signals (VGH) inputted by the input end of the seventh transistor (T7) operate as the pull-down control signals (C1) and are outputted to the second node (Pn). The control ends of the fifth transistor (T5) and the fourth transistor (T4) are at the high level. Thus, the fifth transistor (T5) and the fourth transistor (T4) are turned on. As such, the first node (Qn) and the second node (Pn) are respectively at the low level and the high level.

During the touch stage, with respect to each of the buffer GOA driving circuits 212, when being driven by the above four stages, the output signals are transferred between the levels. It is to be noted that in the above output stage, the output signals (Gn) outputted from the output ends of the second transistor (T2) and the third transistor (T3) operate as the level transfer signals.

In addition, in order to reduce the number of the levels of the buffer GOA driving circuits 212, in the embodiment, when during the touch stage, the periods of the first clock signals (CK) and the second clock signals (XCK) have been gradually increased. In addition, the first clock signals (CK) are opposite to the second clock signals (XCK). In this way, the space occupied by the buffer GOA driving circuits 212 may be reduced even though the buffer GOA driving circuit 212 is capable of transmitting the level signals.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A gate driver, comprising:
   a plurality of gate driver units, each of the gate driver units comprising a gate driver on array (GOA) driving circuit and at least one buffer GOA driving circuits at multiple levels;
   the GOA driving circuit outputting output signals during a display stage, wherein the output signals are transmitted to gate lines and the buffer GOA driving circuits at multiple levels; and
   the output signals are transmitted between the levels when the buffer GOA driving circuits at the multiple levels are during a touch stage, and the output signals are transmitted to the GOA driving circuit of the driving unit at the next level;
   wherein the GOA driving circuit comprises:
   a level transfer device configured for receiving the output signals outputted from the previous level and second clock signals, and for outputting first control signals in accordance with the output signals outputted from the previous level and the second clock signals, wherein the GOA driving circuit of the driving unit at the first level receives default initial signals and the second clock signals;
   an output device configured for receiving the first control signals and the first clock signals, outputting the output signals in accordance with the first control signals and the first clock signals, wherein the first clock signals and the second clock signals are opposite to each other;
   a pull-down device configured for receiving the first control signals and low level signals, and for stopping the output device from outputting in accordance with the first control signals and the low level signals; and
   a pull-down maintaining device configured for receiving high level signals, the low level signals, and the second clock signals, and for outputting pull-down control signals in accordance with the high level signals, the low level signals and the second clock signals, and wherein the pull-down control signals controls the pull-down device to stop the output of the output device;
   wherein the level transfer device further comprises a first transistor, a control end of the first transistor receives the second clock signals, an input end of the first transistor receives the output signals of the previous level, and an output end of the first transistor outputs the first control signals;
   wherein the output device comprises a second transistor and a third transistor, a control end of the second transistor connects to the output end of the first transistor, an input end of the second transistor receives the first clock signals, and an output end of the second transistor outputs the output signals; and
   a control end of the third transistor connects to the output end of the first transistor, an input end of the third transistor receives the first clock signals, and an output end of the third transistor outputs the output signals;

wherein the pull-down device comprises a fourth transistor and a fifth transistor, a control end of the fourth transistor receives the pull-down control signals, an input end of the fourth transistor connects to the output end of the third transistor, and the output end of the fourth transistor receives the low level signals; and a control end of the fifth transistor receives the pull-down control signals, an input end of the fifth transistor connects to the output end of the first transistor, and the output end of the fifth transistor receives the low-level signals;

wherein the pull-down maintaining device comprises a sixth transistor, a seventh transistor, an eighth transistor and a capacitor;

wherein a control end of the sixth transistor connects to the output end of the first transistor, an input end of the sixth transistor connects to the control end of the fifth transistor, and the output end of the sixth transistor receives the low level signals;

a control end of the seventh transistor connects to an input end of the eighth transistor, an input end of the seventh transistor receives the high level signals, and an output end of the seventh transistor connects to the control end of the fifth transistor;

a control end of the eighth transistor connects to the output end of the first transistor, and an output end of the eighth transistor receives the low level signals; and one end of the capacitor receives the second clock signals, and the other end of the capacitor connects to the input end of the eighth transistor.

2. The gate driver as claimed in claim 1, wherein structures of the buffer GOA driving circuits at each of the levels are the same with the structures of the GOA driving circuit.

3. The gate driver as claimed in claim 2, wherein the first transistor to the eighth transistor are N-type transistors, and the control ends of the transistors correspond to gates of the N-type transistor, the input ends correspond to sources of the N-type transistor, and the output end correspond to drains of the N-type transistor.

4. The gate driver as claimed in claim 3, wherein during the touch stage, time periods of the first clock signals and the second clock signals are gradually increased.

5. A touch panel, comprising:

a gate driver comprises a plurality of gate driver units, each of the gate driver units comprising a gate driver on array (GOA) driving circuit and at least one buffer GOA driving circuits at multiple levels;

the GOA driving circuit outputting output signals during a display stage, wherein the output signals are transmitted to gate lines and the buffer GOA driving circuits at multiple levels; and the output signals are transmitted between the levels when the buffer GOA driving circuits at the multiple levels are during a touch stage, and the output signals are transmitted to the GOA driving circuit of the driving unit at the next level;

wherein the GOA driving circuit comprises:

a level transfer device configured for receiving the output signals outputted from the previous level and second clock signals, and for outputting first control signals in accordance with the output signals outputted from the previous level and the second clock signals, wherein the GOA driving circuit of the driving unit at the first level receives default initial signals and the second clock signals;

an output device configured for receiving the first control signals and the first clock signals , outputting the output signals in accordance with the first control signals and the first clock signals, wherein the first clock signals and the second clock signals are opposite to each other;

a pull-down device configured for receiving the first control signals and low level signals, and for stopping the output device from outputting in accordance with the first control signals and the low level signals; and a pull-down maintaining device configured for receiving high level signals, the low level signals, and the second clock signals, and for outputting pull-down control signals in accordance with the high level signals, the low level signals and the second clock signals, and wherein the pull-down control signals controls the pull-down device to stop the output of the output device;

wherein the level transfer device further comprises a first transistor, a control end of the first transistor receives the second clock signals, an input end of the first transistor receives the output signals of the previous level, and an output end of the first transistor outputs the first control signals;

wherein the output device comprises a second transistor and a third transistor, a control end of the second transistor connects to the output end of the first transistor, an input end of the second transistor receives the first clock signals, and an output end of the second transistor outputs the output signals; and a control end of the third transistor connects to the output end of the first transistor, an input end of the third transistor receives the first clock signals, and an output end of the third transistor outputs the output signals;

wherein the pull-down device comprises a fourth transistor and a fifth transistor, a control end of the fourth transistor receives the pull-down control signals, an input end of the fourth transistor connects to the output end of the third transistor, and the output end of the fourth transistor receives the low level signals; and a control end of the fifth transistor receives the pull-down control signals, an input end of the fifth transistor connects to the output end of the first transistor, and the output end of the fifth transistor receives the low-level signals;

wherein the pull-down maintaining device comprises a sixth transistor, a seventh transistor, an eighth transistor and a capacitor;

wherein a control end of the sixth transistor connects to the output end of the first transistor, an input end of the sixth transistor connects to the control end of the fifth transistor, and the output end of the sixth transistor receives the low level signals;

a control end of the seventh transistor connects to an input end of the eighth transistor, an input end of the seventh transistor receives the high level signals, and an output end of the seventh transistor connects to the control end of the fifth transistor;

a control end of the eighth transistor connects to the output end of the first transistor, and an output end of the eighth transistor receives the low level signals; and one end of the capacitor receives the second clock signals, and the other end of the capacitor connects to the input end of the eighth transistor.

* * * * *